United States Patent
Shute

(10) Patent No.: US 8,391,814 B2
(45) Date of Patent: Mar. 5, 2013

(54) POWER CONTROL LOOP, TRANSMITTER WITH THE POWER CONTROL LOOP AND METHOD FOR CONTROLLING OUTPUT POWER OF A TRANSMITTER DEVICE

(75) Inventor: Nick Shute, München (DE)

(73) Assignee: Intel Mobile Communications GmbH, Neubiberg (DE)

( * ) Notice: Subject to any disclaimer, the term of this patent is extended or adjusted under 35 U.S.C. 154(b) by 1446 days.

(21) Appl. No.: 11/958,949

(22) Filed: Dec. 18, 2007

(65) Prior Publication Data

US 2009/0156143 A1 Jun. 18, 2009

(51) Int. Cl.
*H01Q 11/12* (2006.01)
(52) U.S. Cl. ............... 455/127.2; 455/245.1; 455/456.1
(58) Field of Classification Search ............... 455/127.2
See application file for complete search history.

(56) References Cited

U.S. PATENT DOCUMENTS

| | | | |
|---|---|---|---|
| 6,519,293 B1 * | 2/2003 | Miyake | 375/297 |
| 6,650,875 B1 | 11/2003 | Rozenblit et al. | |
| 6,865,396 B2 | 3/2005 | Niemela | |
| 7,099,636 B2 | 8/2006 | Rozenblit et al. | |
| 7,480,344 B2 * | 1/2009 | Zolfaghari et al. | 375/297 |
| 2003/0062950 A1 | 4/2003 | Hamada et al. | |
| 2003/0114127 A1 * | 6/2003 | Baldwin | 455/245.1 |
| 2005/0130672 A1 * | 6/2005 | Dean et al. | 455/456.1 |
| 2006/0239380 A1 * | 10/2006 | Khlat et al. | 375/297 |

FOREIGN PATENT DOCUMENTS

WO WO 02/103924 A1 12/2002

* cited by examiner

*Primary Examiner* — Duc Nguyen
*Assistant Examiner* — Ajibola Akinyemi
(74) *Attorney, Agent, or Firm* — Eschweiler & Associates, LLC

(57) ABSTRACT

A power control loop includes a low-frequency signal path and a high-frequency signal path with the delay compensation block. The delay compensation block is used to determine a correlation between an average reference level and an average measured power level. The result may control a delay line to compensate a time misalignment in the power control loop.

16 Claims, 13 Drawing Sheets

US 8,391,814 B2

POWER CONTROL LOOP, TRANSMITTER WITH THE POWER CONTROL LOOP AND METHOD FOR CONTROLLING OUTPUT POWER OF A TRANSMITTER DEVICE

FIELD OF INVENTION

The invention relates to an improved power control loop useable for a variety of applications and to a transmitter with such power control loop. The invention relates also to a method for controlling the output power of a transmitter device.

BACKGROUND OF THE INVENTION

Power control loops are used in a variety of applications to control the output power of a device. In a typical example a transmitter arrangement comprises an amplifier with an adjustable gain. If the average output power of the amplifier is to be kept at a similar level independently of parameter variations, it may be necessary to adjust the gain automatically. For this purpose a power control loop can be used. Generally, such power control loop determines the output power of the amplifier and compares the determined value with a reference value. In response to the comparison result the power control loop generates an adjustment signal to adjust the gain of the amplifier. Consequently, the power control loop stabilizes and locks the output power to a specific value. In addition, a power control loop can be used to generate so called power steps, wherein the output power of the amplifier is changed not continuously but in discrete steps. In such an application the reference for the comparison is changed. The power control loop then adjusts the gain of the amplifier until the output power settles to the new value.

Nevertheless there is a demand to further improve power control loops.

BRIEF DESCRIPTION OF THE DRAWINGS

The different aspects and embodiments will be explained in more detail hereafter with reference to the accompanying drawings in which.

DETAILED DESCRIPTION OF THE INVENTION

Figure 1:
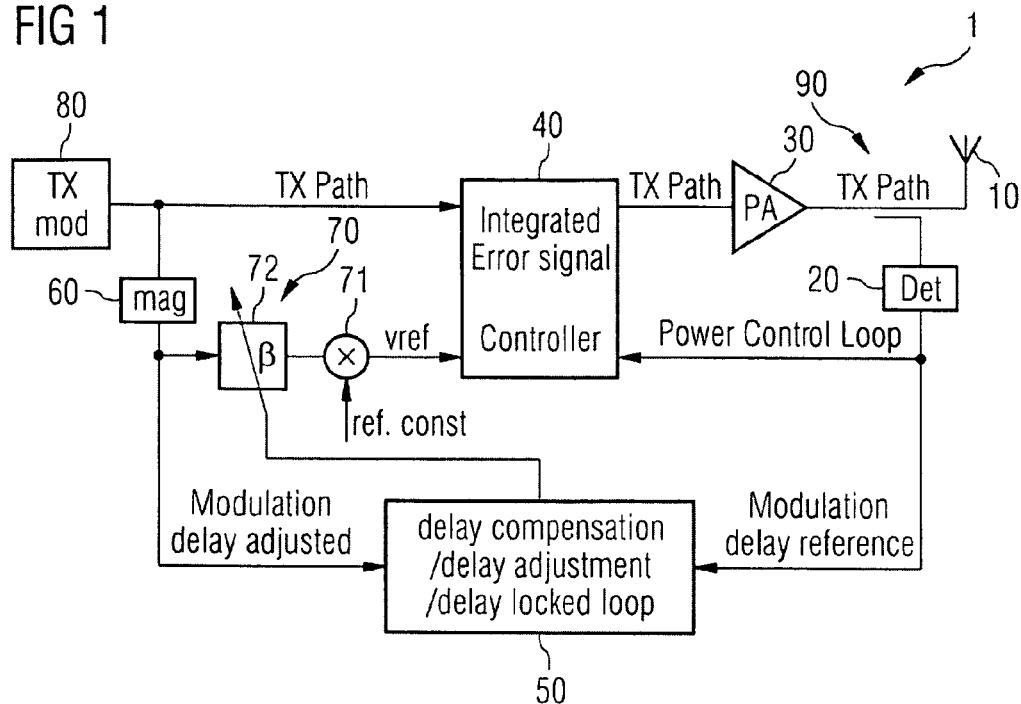
FIG. 1 illustrates a first schematic view of an embodiment of a power control loop.

In the following description, further aspects and embodiments of the present invention are disclosed. In addition, reference is made to the accompanying drawings which form a part hereof. The drawings show by way of illustration in which different aspects of the invention may be practiced. The embodiments of the drawings present a discussion in order to provide a better understanding of one or more aspects of the present invention. The disclosure is not intended to limit the feature or key elements of the invention to a specific embodiment. Rather, the different elements, aspects, and features disclosed in the embodiments can be combined in various ways by a person skilled in the art to achieve one or more advantages of the present invention. It is to be understood that other embodiments may be utilized and structural or logical changes may be made without departing from the scope of the invention. The elements of the drawings are not necessarily to scale relative to each other. For illustration purposes some communication standards are described. These communication standards referred to herein are not restricted to the disclosed embodiments. Other communication standards, signal frequencies and or power ranges can also be used to achieve the different aspect of the present invention. Like reference numerals designate corresponding similar parts.

FIG. 1 shows a schematic view of a power control loop in a transmitter device illustrating one or more aspects.

Power control loops are used in different applications, for instance, in transmitter for mobile communication devices. When transmitting signals according to one or more mobile communication standards, the signals often have to be transmitted at specified average power levels. Such average power level is often referred to as an "RMS" level. The term "RMS" is an abbreviation for "root means square" and represents the real or true average power of the signal over time. The signal to be transmitted may comprise, for example, a phase modulated signal, an amplitude modulated signal or a combination thereof. Particularly, modern communication systems are using phase and amplitude modulated signals. Such signals may comprise high instant power levels, while the average power may be significantly lower. This characteristic of the signal can be more clearly described as crest factor. The term "crest factor" defines the maximum instant power of a signal above the average power level. In modern telecommunication systems using for example the WB-CDMA/UMTS or WLAN telecommunication standards, the crest factor may comprise values up to several 10 dB, resulting in high instant power levels at moderate average power. Further, the crest factor and the RMS level may depend on the signal statistics. For instance a signal with a 4-qpsk modulation type may comprise a different crest factor and RMS value compared to a signal with the same content but comprising a 16-quadrature amplitude modulation.

For signals with a high crest factor, the lock-in time of a conventional integrating power control loop is related to the amount of filtering. Filtering is required to reduce the crest factor of the detected signal to an average power level having an acceptable settled deviation of an integrated error signal. Since the power control loop is also used to control steps and variation in the average output power, the deviation of the integrated error signal directly relates to an error during transition between different average output powers controlled by the power control loop.

The transmitter device according to FIG. 1 comprises a transmission path TX Path with a modulator device 80 generating phase and amplitude modulated RF signals. The output signals of the modulator device 80 are applied to a controller device 40. The controller device 40 includes a variable gain amplifier, not shown herein, to adjust the average output power of the signal. The controller device 40 is part of the power control loop in the transmitter device. An output of the gain amplifier of the controller device 40 is coupled to a power amplifier 30 of the transmission device. The output of the power amplifier is connected to a coupling device 90 and to an antenna 10 for transmission. For controlling the average output power, the power control loop comprises a detector 20 for detecting a power level of a signal portion provided by the coupling device 90. The detector 20 may be implemented in one embodiment as an envelope detector measuring the envelope of an RF signal and then determining the envelope power level. The detector 20 is connected to the controller device 40.

In addition, the amplitude of the signal generated by the modulator device 80 is determined in one embodiment by a reference envelope detector 60 and applied to a multiplier unit 71 of the power control loop as a reference value. The reference envelope detector 60 is used to determine the reference modulation signal amplitude, the reference modulation envelope or a filtered version of the modulation envelope's amplitude. The output of the detector is coupled to the power control loop 40.

With the determination by the reference envelope detector 60 the correct modulated envelope reference is used for a comparison with the measured signal envelope arriving from the detector 20. Different signals can have different mean to RMS relationships. The power control loop (PCL) regulates the mean of the signals. If the modulated envelope information in the reference path is not used, an error in RMS output power may occur when the signal modulation is changed. For instance, if signal data-rate or type is changed, the signals statistics would change which would result in a different RMS level and different crest-factor.

In one embodiment, in the multiplier device 71 the reference value may be multiplied with a constant reference factor. The reference factor ref.const can be used, for example, to apply power steps or to compensate for other variations of the total output power at the amplifier 30. The output vref of the multiplier device 71 is applied to the controller device 40. Finally, the controller device provides an integrated error signal to adjust the gain of the variable gain amplifier.

When transmitting signals with high crest factors, the detector 20 at the output of the transmission path may determine an increase in the average output power due to the instant power peak. This increase may be applied to the controller device 40. Consequently, signals with high crest factors may influence the overall integrated error signal and can vary the step error for fixed loop parameters.

The influence of high crest factors on the integrated error signal can be reduced by applying averaging on the error signal, thereby decreasing the deviation around the RMS power level, resulting in a more accurate measured average power level. However, this procedure requires additional averaging time, which is added to the total lock-time. Alternately, the problem could be avoided by trading performance with another system parameter, for example, allowing a conventional power control loop to settle for a longer period of time at the expense of signal quality.

In the proposed embodiment, the power control loop is improved by using a high pass filtered portion of the measured power level to adjust the timing of the power control loop reference signal. The use of additional signal processing reduces the sensitivity of a delay between the reference envelope power levels and the measured envelop power level to the integrated error signal of the power control loop.

The adjustment is done in such way that the reference power level is in time with the measured power level, hence removing delay and minimizing deviation of the integrated error signal in the power control loop. For this purpose, the output signals of the envelope detector 20 and reference envelope detector 60 are applied to a delay compensation device 50. The delay compensation device 50 calculates and determines the deviation of the timing between the reference power level from the reference envelope detector 60 and the measured power level from the detector 20. A corresponding adjustment signal is generated and applied to a delay chain 72 arranged between the reference envelope detector 60 and the multiplier device 71 in a reference path of the power control loop.

The delay compensation block 50 may comprise a delay locked loop, which is sensitive to zero crossings of the applied signal. The signals provided by the detector 20 and reference envelope detector 60 may comprise a high-pass or band-pass filtered power level signal within the delay compensation block. The filtering removes average signal portions (for instance the DC level) so that the reference and the measured signals can be centered ready for zero crossing detection. The delay compensation block 50 may lock to the zero crossings of the high-pass filtered signal and not the phase of the modulated signal, as would be the case in a phase locked loop. In the locked condition, the reference and measurement path of the power control loop are aligned in time, removing RMS deviation due to modulation on the integrated error signal in the power control loop.

Consequently, any deviation of the integrated error signal by the power control loop is significantly reduced, improving quality and dynamics of the power control loop. In addition, the delay compensation block 50 is insensitive to power changes applied to the power control loop as the compensation block 50 operates on the high-pass or band-pass filtered signal, in which the average signal portions are removed. As the power control loop now regulates the envelope of the measured signal and not a mean value with a minimized error portion due to the alignment and compensation, the loop bandwidth can be increased. It is also possible to reduce the look-time of the power control loop.

Figure 2:
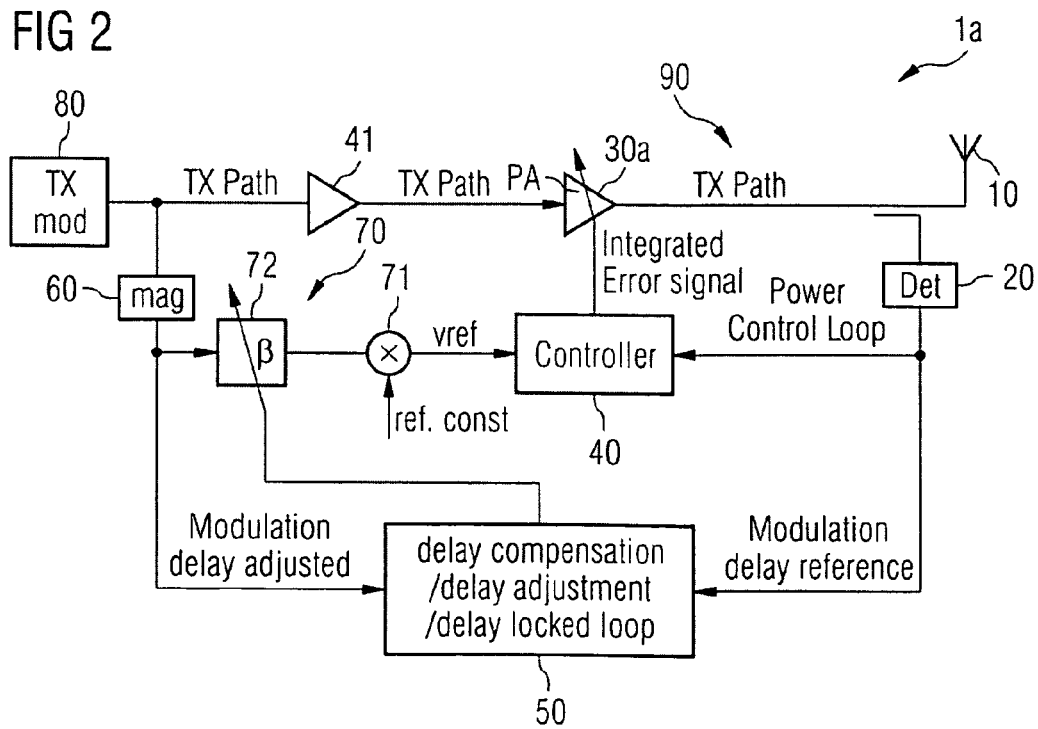
FIG. 2 illustrates a second schematic view of an embodiment of a power control loop.

FIG. 2 illustrates a further embodiment of a transmitter with a power control loop. In this embodiment, the power amplifier 30a in the transmitter path TX path comprises an adjustable gain. The gain of the power amplifier 30a is controlled by a separate controller device 40a being part of the power control loop. The input of the power amplifier 30a is connected to an output of a first amplifier 41 coupled to the modulator device 80. The controller 40a of the power control loop adjusts the gain of the power amplifier 30a and controls the average output power. It further controls the power steps indicated by different reference values applied to the multiplier device 71 in the reference path of the power control loop. The high-pass filtered reference envelope power level and measured envelope power level are processed in the delay compensation block 50. The delay compensation block 50 provides a control signal to the delay element 72 in the reference path of the power control loop. The adjustable delay of the reference envelope power level reduces the deviation in the overall error signal of the power control loop significantly compared to a conventional integrating power control loop. The controller 40a may comprise a proportional controller (P-controller), generating a control signal for the power amplifier 30a proportional to the integrated error signal. It may also comprise a so called PI or PID controller (proportional integrating or proportional integrating & differential controller).

Figure 3:
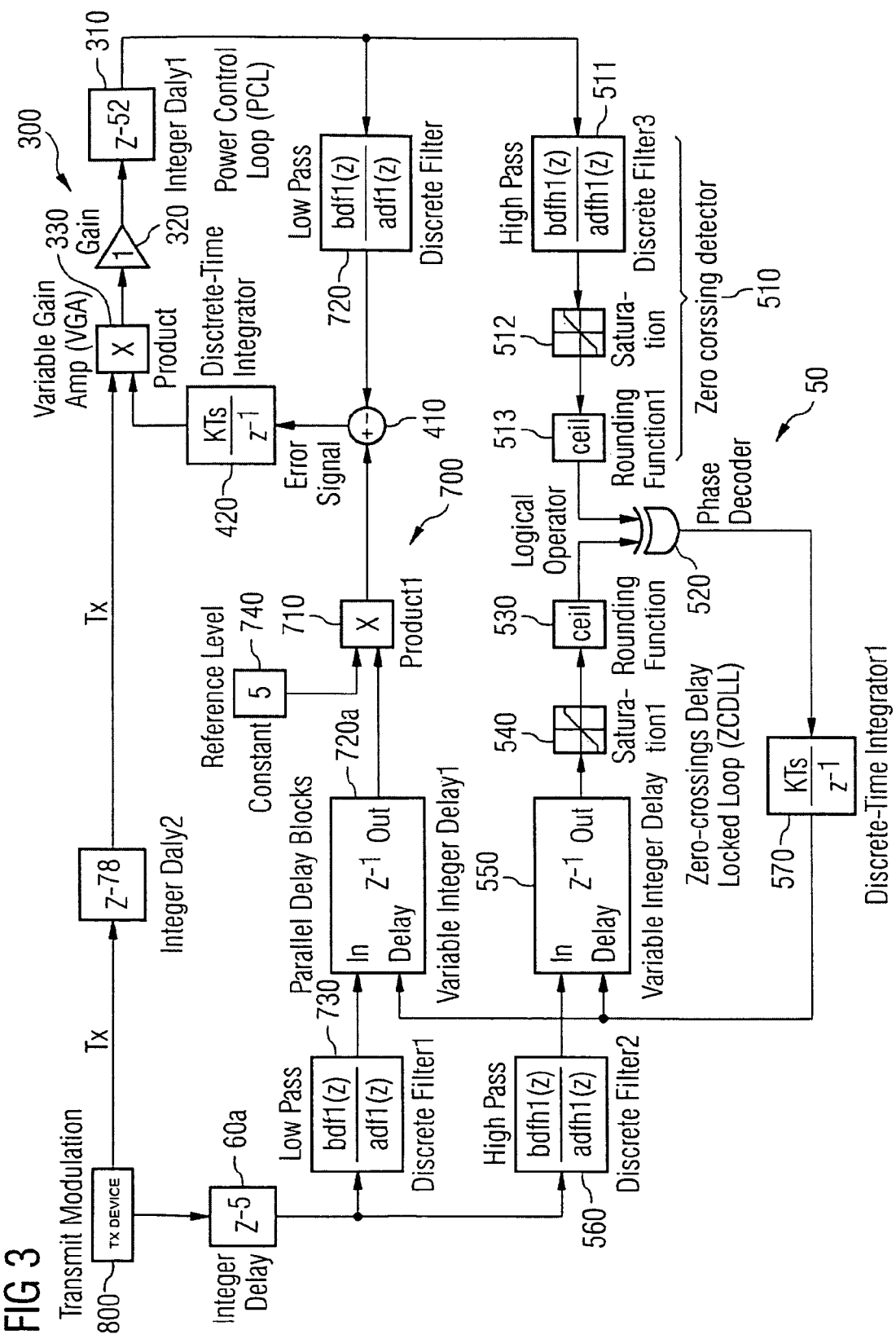
FIG. 3 shows a more detailed view of a power control loop embodiment, illustrated with the signal transfer characteristics of several elements of the power control loop.

FIG. 3 illustrates in the baseband envelope domain the signal transfer characteristic of several circuit elements of the transmitter device with a power control loop according to one embodiment. Of course, devices and circuits of the transmitter device may comprise one or more of those signal transfer characteristics. For simplification purposes the Figure does not show HF-signals but illustrates the characteristics for envelope or baseband signals only.

The transmitter device 800 generates an amplitude and phase modulated RF signal. The signal is provided at the output of the device 800 in the transmitter path TX and applied to various devices and circuits as indicated by a first integer delay element Integer Delay 2. The element Integer Delay 2 may represent a delay caused by the circuits in the transmitter path like, for example, filters, amplifiers or conductor lines. The transmitter path TX also comprises a variable gain amplifier 300 including the elements 330, 320 and 310 indicating the different signal transfer characteristics of the amplifier 300. The element 330 represents a multiplication of the signal of the transmitter path applied to its first input with a multiplication factor provided by the power control loop PCL. The output of the element 330 is applied to a gain element 320 and to an integer delay element 310 representing the gain of the variable gain amplifier as well as a signal delay of the amplifier.

The power control loop itself comprises a low frequency signal path with a reference path and a measurement path. The reference path comprises an element 730 with a low-pass filter characteristic and an element 710 with a multiplier transfer characteristic. An element 410 with an additive characteristic and a second low-pass filter element 720 are disposed in the measurement path. An input of the first low-pass filter element 730 is connected to an element 60a with an integer delay transfer characteristic corresponding to the reference envelope detector. The first low-pass filter element 730 is also coupled to an element 720a with a parallel delay block transfer characteristic representing a variable delay line. The output of the element 720a is connected to a first input of the multiplier element 710. The signal provided by the parallel delay block element 720a is multiplied with a constant reference level provided by the element 740.

In the measurement path of the power control loop the second low-pass discrete filter element 720 is coupled with its input to the output of element 310 of the variable gain amplifier 300. The output of the element 720 with a low-pass filter characteristic is connected to element 410. The error signal at the output of element 410 corresponds to the difference between the reference signal provided by the multiplier element 710 and the second low-pass filter element 720 of the power control loop. In other words, the element 410 compares the signal of the reference path provided by the multiplier element 710 with the low-pass filtered signal of the measurement path. If both signals are approximately equal, the average output power of the variable gain amplifier 300 corresponds to the desired output power indicated by the signal of the power control loop's reference path. The result as an error signal is applied to an element 420 having a discrete-time integration function in one embodiment. The integrated error signal corresponds to the multiplication factor applied to the product element 330 of the variable gain amplifier 300.

To decrease the influence crest factor in a signal provided by device 800 and to obtain a faster lock-time, the signal in the reference path of the power control loop is delayed by a factor calculated and determined in the delay compensation block 50. The delay compensation block 50 is arranged in parallel to the power control loop receiving the output signal of elements 310 and 60a. The compensation block 50 removes the above mentioned sensitivity to the crest factor and the lock-time by adjusting the delay block 720a thereby delaying a signal in the reference path with respect to the corresponding signal of the measurement path of the power control loop.

For this purpose, the compensation block 50 may comprise a delay locked loop in combination with power control loop to adjust the zero crossings of a reference signal to be in line with zero crossings of another measured signal. Adjusting the zero crossings removes the delay between the power control loop's measurement and reference paths and hence reduces the deviation in the error signal to a very low value, hence removing any residual modulation from the amplifier's control input.

The element 310 is coupled to an element 510 of the compensation block 50 for zero crossing detection indicated by elements 511, 512 and 513. Element 511 comprises a high-pass filter characteristic and element 512 a saturation behavior. Element 513 comprises a rounding transfer function. The element 511 removes the average and low frequency portions of the output signal. Consequently, the high-frequency portions are applied to elements 512 and 513. Elements 512 and 513 then detect a zero crossing in the remaining signal portion and provide a corresponding output signal.

The output signal of element 60a represents the reference power level. This signal is applied to an element 560 also having a high-pass filter transfer function. The output of element 560 is connected to an element 550 comprising a variable integer delay transfer function. The delay of the element 550 is controlled by a signal provided by an element 570 comprising a discrete time integrating transfer characteristic. Consequently, the delay of element 550 is equal to the delay of the parallel delay block element 720a in the reference path of the power control loop.

The output of element 550 is connected to elements 540 and 530 comprising saturation and rounding transfer characteristic. These elements are similar to elements 513 and 512 of the zero crossing detector 510. The outputs of the ceil elements 513 and 530 are connected to a logical operator element 520 representing a phase detector. The output of the delay detector 520 is applied to element 570.

In operation, the compensation delay block 50 detects zero crossings of the high-frequency portion of the measured power level signal and the reference power level signal. This is done by the zero crossing detector 510 and the corresponding elements 560, 540 and 530. The time difference between zero crossings of the measured power level signal and the reference power level signal is determined by the delay detector 520 and applied to element 570. The integrated error signal provided by the element 570 is used as an adjustment signal to change the delay of both elements 720 and 550, respectively. Consequently, the delay is adjusted in such a way that the zero crossings of the reference power level signal are inline with zero crossings of the measured power level signal. Since the high-pass filtering by the element 511 and the element 560 is insensitive to dynamic power changes in the power control loop, power scaling function and delay locking can be effectively separated. The adjustment signal of element 570 applied to the delay block 720 of the reference path in the power control loop delays the reference envelope power level signal until it is aligned with the measured envelope power level signal.

The different elements of the compensation block 50 as well as of the power control loop can be implemented using analog components or digital components. When using digital components the error signal may be reduced to a level related to the time period of the system sample frequency.

Figure 4:
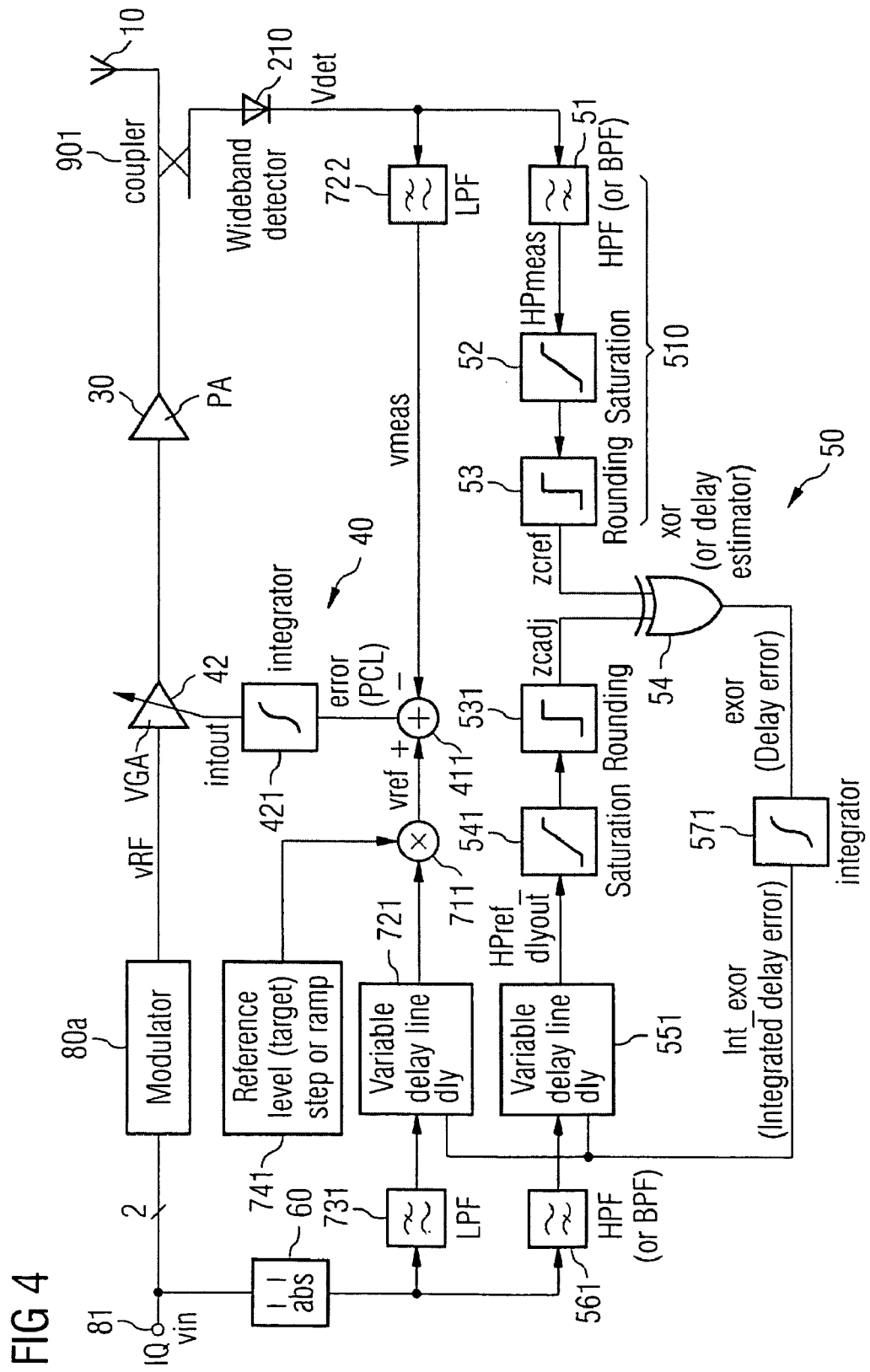
FIG. 4 shows a more detailed embodiment of a power control loop according to FIG. 1, FIG. 5A to FIG. 5F show different signals over time generated and processed in the embodiment according to FIG. 4.

FIG. 4 illustrates an embodiment of a transmitter device with a transmitter path, a control loop 40 and a delay compensation block 50. The transmitter path of the device illustrated in FIG. 4 comprises an input terminal 81, on which in this embodiment an analog IQ-signal is applied. The term "IQ-signal" specifies a signal with two different components I and Q having a phase shift of 90° with respect to each other. Both components I, Q may be phase-modulated and amplitude-modulated. The IQ-signal is supplied to a modulator block 80*a*, which may comprise an IQ-modulator, distortion components and a local oscillator, for example. Other circuitry, like filters, may be included in the modulator block 80*a* as well. The modulator block 80*a* generates a phase- and amplitude-modulated RF signal vRF.

The RF signal vRF is applied to a variable gain amplifier 42 having a gain control input. The output of the variable gain amplifier 42 is connected to a power amplifier 30. A coupler unit 901 is arranged between the output of the power amplifier 30 and an antenna 10. In operation, the modulator block 80*a* modulates the IQ-signal on a carrier RF signal and provides the amplitude and phase modulated RF signal vRF to the variable gain amplifier 42. The amplified signal by the amplifier 42 is amplified again in the power amplifier 30 and transmitted via the antenna 10. A portion of the amplified RF signal is coupled by the coupler 901 and applied to a wideband detector 201. The wideband detector 201 measures the envelope of the output signal and determines the instantaneous envelope power level. Its output represents the measured envelope power level vdet.

The IQ-signal at terminal 81 is also applied to a reference envelope detector 60, which determines the absolute value of the IQ-signal. This value represents the instantaneous reference envelope power level. The reference envelope power level is applied to a low-pass filter 731 connected to a variable delay line circuit 721. The variable delay line 721 delays the signal at its input by a specific time span in response to a control signal on input dly. The delayed reference envelope power level may be multiplied by a factor provided by block 741 in the multiplier 711. The output signal vref of the multiplier 711 represents the desired reference instantaneous envelope power level. Filter 731, delay line 721 and multiplier 711 are arranged in the reference path of the power control loop. The output signal at output of element 741 may represent the desired average power level.

The measured envelope power level vdet provided by the wideband detector 201 is applied to a low-pass filter 722 in the measurement path of the power control loop 40. The filter 721 may comprise the same edge frequency and signal characteristic as the low-pass filter 731 in the reference path of the power control loop. The output of the low-pass filter 722 is connected to an adder element 411. A second input of the adder element 411 is connected to multiplier 711 to receive the desired reference power level vref. The adder element 411 generates the difference between the desired reference envelope power level vref and the filtered measured envelope power level vmeas. The result, corresponding to an error signal error(PCL) of the power control loop, is applied to an integrator 421. The integrator 421 generates the control signal intout for controlling and adjusting the gain of the variable gain amplifier 42.

To reduce undesired deviation in the error signal "error (PCL)" due to time misalignment between the reference path and the measurement paths of the power control loop 40 as well as to decrease the crest factor's influence on the error signal, the output of the wideband detector 201 is also connected to a high-pass filter 51 in one embodiment. The output of the high-pass filter 51 is connected to a saturation device 52, which is coupled to a rounding or ceil circuit 53. Filter 51, device 52 and circuit 53 form a zero crossing detector 510. The output of the rounding circuit 53 is connected to an input of a logical operator 54.

The output of the reference envelope power detector 60 is also connected to a second high-pass filter 561 coupled to a variable delay line 551. The variable delay line 551 comprises a plurality of delay elements similar to the variable delay line 721. The output of the variable delay line 551 is coupled to a saturation element 541 and a rounding circuit 531. The output of the rounding circuit 531 is connected to the second input of the logical operator 54. The circuit 54 may comprise a XOR operator to provide a logical delay error signal exor to an integrator 571. The integrated delay error signal int_exor is applied as an adjustment word to the variable delay lines 551 and 721 to adjust the delay in both delay lines.

The integrated delay error signal int_exor may comprise positive or negative values, depending on the comparison in the XOR operator. Consequently, one may think of a "negative" delay corresponding to an additional delay in the measurement path of the power control loop 40. Such negative delay may be useful, if signal processing in the reference path of the power control loop takes longer time than signal processing in the transmitter path and the measurement path of the power control loop.

FIGS. 5A to 5F show various signals over time to illustrate the operation of the compensation block 50. In operation, the reference envelope power level detector 60 as well as the wideband detector 201 provides a signal proportional to the envelope power level at their inputs. The measured output envelope power vdet detected by the wideband detector 201 is high-pass filtered in filter 51 to remove low-frequency or DC portions. The high-pass filtered signal HPmeas with DC and low frequency portion removed can be seen in FIG. 5A.

At the same time, the envelope power of the IQ-signal at terminal 81 is determined by the reference envelope detector 60 and high-pass filtered in filter 561. The filtered signal is applied to the variable delay line 551 which, in this example, is first of all adjusted not to delay the signal at all, "dly=0". The resulted signal HPref_dlyout can be seen in FIG. 5B.

Figure 5A:
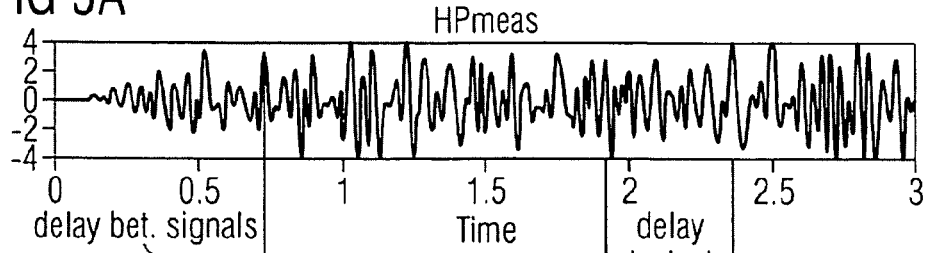
Figure 5B:
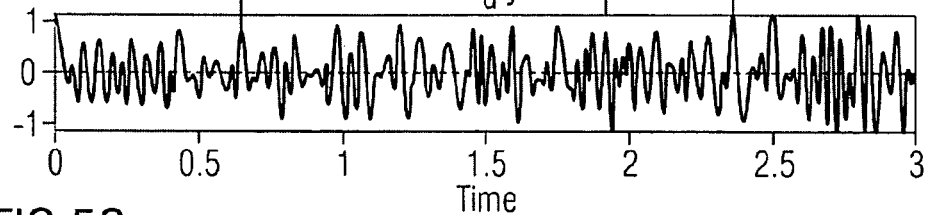
Figure 5C:
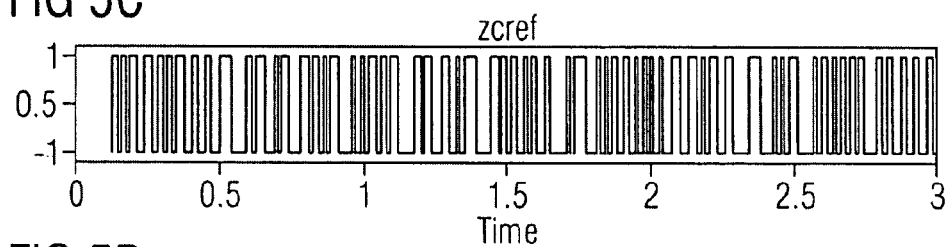
Figure 5D:

Both high-pass filtered signals HPmeas and HPref_dlyout are amplified until saturation in devices 52 and 541 and provided to the rounding circuits 53 and 531, respectively. The saturation and successive rounding process result in pulsed signals zcref and zcadj, which can be seen in FIGS. 5C and 5D, respectively. As illustrated in FIG. 5C, the zero crossings of the high-pass filtered measured signal HPmeas are somewhat delayed with respect to the zero crossings of the filtered reference signal HPref_dlyout. Consequently, zcref is delayed compared to signal zcadj.

Figure 5E:
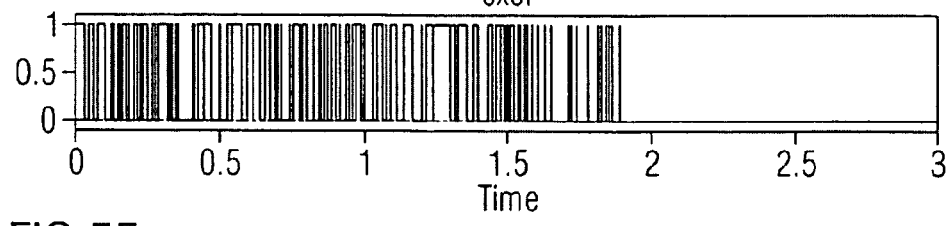
Figure 5F:
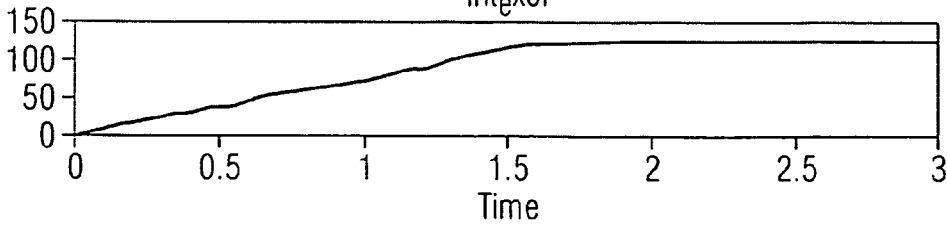

The pulsed signals indicating the zero crossings are applied to the XOR element 54 for further signal processing. The delay error signal exor, representing the results of the XOR operation, is shown in FIG. 5E. The delay error exor is integrated in element 571 to generate the integrated delay error int_exor. The integrated delay error int_exor is used as an adjustment or control signal to adjust the variable delay lines 551 and 721, respectively. FIG. 5F illustrates the integrated delay error signal int_exor over time. The integrated error signal int_exor starts to rise from the value 0 to roughly 125 at 1.5 time units. During this time, the delay of the variable delay lines 721 and 551 are successively increased. Consequently the filtered reference signal is delayed until the zero crossing of signals zcadj and zcref from the rounding devices 531 and 53 are substantially aligned in time. At this point, roughly after 1.8 time units, the delay error signal exor decreases significantly. The high-pass filtered measured signal and reference signal as seen in FIGS. 5A and 5B are substantially aligned. As the same delay is applied to the power control loop's 40 reference path, the delay between the signals vref and vmeas is compensated, thereby minimizing the signals "error(PCL)".

Figure 12:
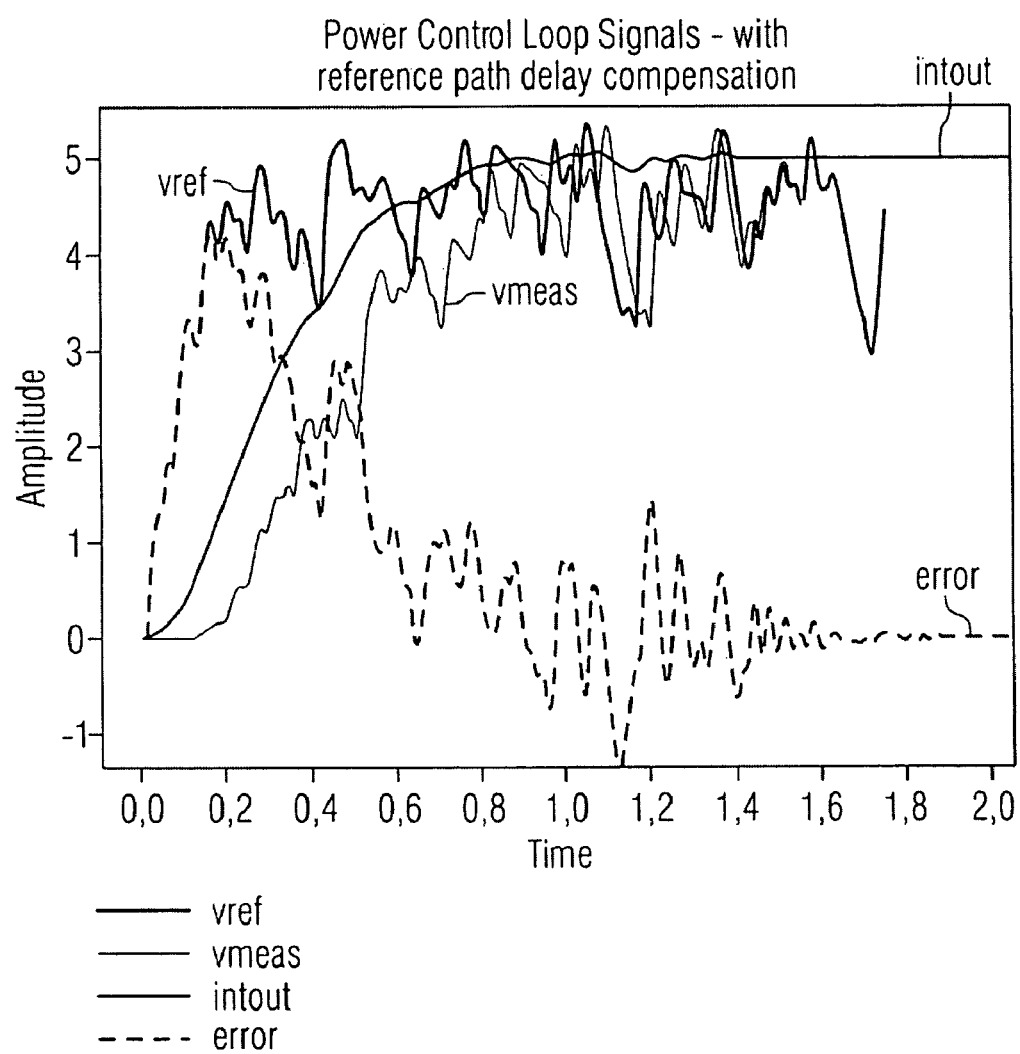
FIG. 12 shows various signals over time illustrating the fast lock-in time during operation of the power control loop according to one of the preceding embodiments.

FIG. 12 shows the amplitude of several signals over time to illustrate the time alignment procedure within the power control loop 40. At the beginning of the alignment process until roughly 1.0 time units, the reference envelope power vref and the corresponding measured envelope power vmeas are misaligned. Consequently, the error signal error from the power control loop 40 representing the difference between the reference envelope power vref and the measured envelope power vmeas is in the range of several amplitude units and fluctuating. The integrator 521 integrates the error signal and provides a corresponding gain adjustment to the variable gain amplifier 42. Due to the alignment caused by the delay in the variable delay line 721 the reference envelope power vref is successively delayed until both signals vref and vmeas are aligned.

Accordingly, the error signal error decreases until it becomes almost zero and the adjustment signal intout of the integrator 421 became constant and stable. The deviation error of the adjustment signal intout is very small and hard to estimate at this resolution. As a result, the deviation of the error signal and of the adjustment signal for the power control loop decrease significantly. Due to the alignment, signals with high crest factor have no or significantly less influence on the power control loop anymore. As the compensation block 50 is used to reduce the deviation in the power control loop error signal error, it has very small effect upon the dynamic of the power control loop and can therefore be run in parallel. This will minimize the lock-time and increase the speed when changing between different average power levels. The compensation block 50 may have a lock-time in the similar order of magnitude to that of the power control loop. The power control loop bandwidth is now less sensitive to the average deviation of the integrated error signal intout. Hence, it is possible to widen the power control loop bandwidth. This may speed up the power control loop, whilst having the compensation block 50 do the delay locking in parallel, to for example a power ramping or an average power change.

Figure 15A:
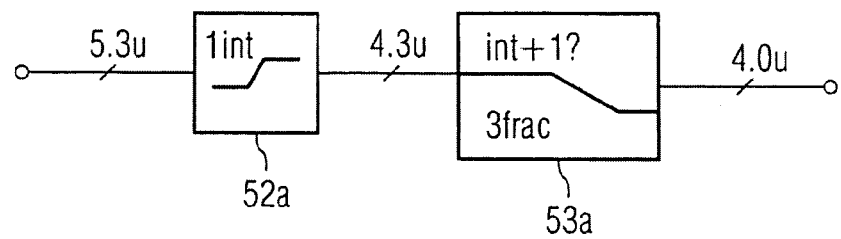
FIG. 15A to FIG. 15B show different embodiments for a digital or analog implementation of the ceiling and saturation circuits in the power control loop.

FIG. 15A illustrates a possible embodiment for the saturation device 52 and the ceiling or rounding device 53 of the detector 510. The saturation and rounding circuits 541 and 531 may be implemented in the same manner. The functionality is explained in this non-limiting example using a 5 bit word with a three bit fractional portion. Of course any other data word with different length can be used as well. The saturation is performed in element 52a and can be digitally implemented by throwing away one or more most significant bits of the data word applied to element 52a to provide upper saturation. So for example if we have a 5 bit number with range from 0 to 31, which we want limit in the range 0 to 15 then we need to throw away one most significant bit. As seen in the example, the bit length of the original data word 5.3 u is reduced to 4.3 u. Implementation of a saturation function for negative numbers depends on the type of numbering system used, for example 'sign-magnitude' or 'two-complement' numbering systems. Saturation is a common digital signal processing function.

The ceiling functionality is performed in element 53a corresponding to circuit 53 in one embodiment. A 'ceil' function can be implemented for positive numbers in digital hardware by increasing the integer part of a fixed point number representation by one if the fractional part is >0, and then finally removal the fractional part or setting all fractional bits to zero. In the example the ceil element 53a outputs a data word comprising only the integer part of the 4 bit data word.

Implementation of a 'ceil' function for negative numbers is simply a case of removal of the fractional bits.

Figure 15B:
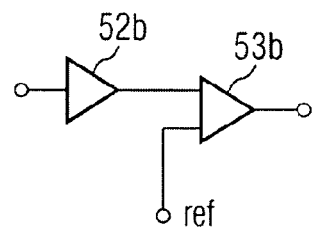

FIG. 15B illustrates a possible embodiment for an analog implementation. A limiting amplifier 52b, corresponding to the saturation device 52 is connected upstream to a comparator 53b. The comparator is used to determine the level by comparing the saturated output signal of the amplifier 52b with a reference signal. More particularly, the comparator block uses a reference level for which the output is high if the input is above the reference level and the output is low if the input is below the reference level. Alternatively, the limiting amplifier could be placed after the comparator to limit the output values to "1" or "0".

Figure 16:
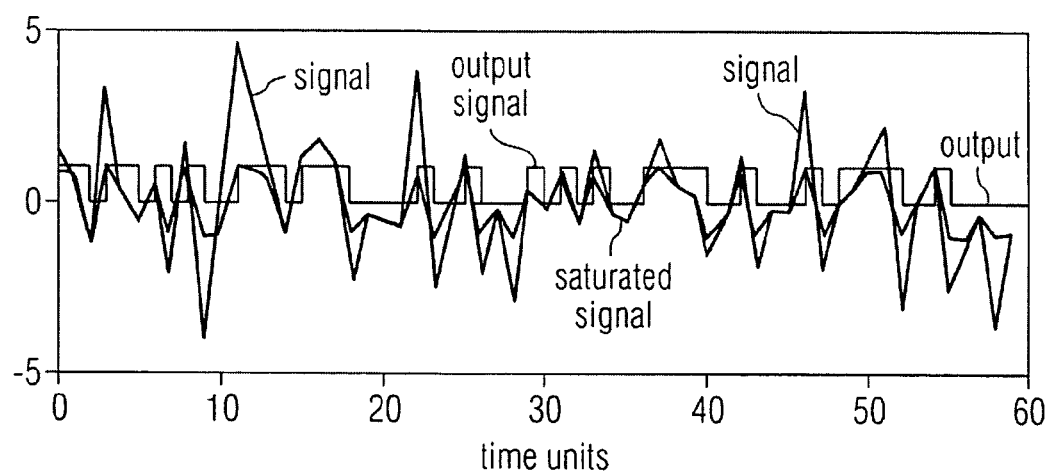
FIG. 16 shows various signals over time illustrating the ceiling and saturation functionality.

FIG. 16 shows the result for a signal applied to the arrangement according to FIG. 15B. The signal is applied at the input of the limiting amplifier 52b, which saturates and limits the signal to a maximum value. The saturated signal is applied to the comparator 53b. The output of the comparator is a digital one bit signal switching between "1" and "0" in response to the input signal.

Figure 6:
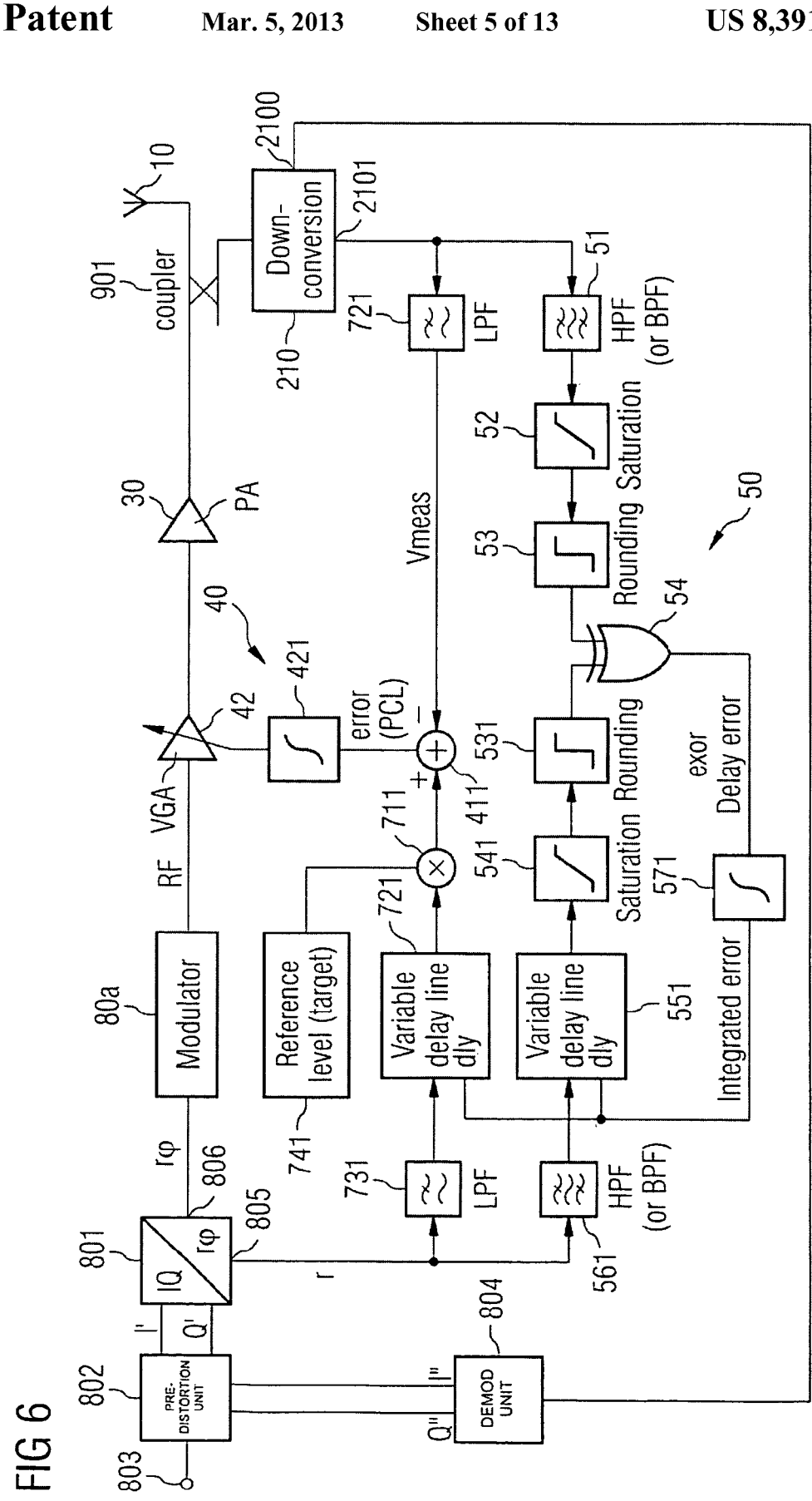
FIG. 6 shows a third embodiment of a power control loop in a transmitter device.

FIG. 6 shows a different embodiment of a transmitter device. The device may comprise a transmitter path and a power control loop with a low frequency path and with a high-frequency path comprising a delay compensation block 50. The signal to be transmitted is applied to terminal 803 connected to a pre-distortion unit 802. The predistortion unit 802 may distort the digital I and Q components with predistortion values thereby compensating any nonlinearity in the transmitter path circuits connected downstream. For example, nonlinearities resulting in an amplitude-to-amplitude distortion or amplitude-to-phase distortion can be corrected by multiplying the digital inphase component I and quadrature component Q with corresponding pre-distortion factors. The pre-distorted components I and Q are applied to a transformation circuit 801 transforming the components I and Q into a digital representation of the amplitude r and the phase p. The amplitude portion r corresponds to the absolute value of the digital pre-distorted components I and Q. The phase portion p represents the angle between the ordinate and the vector sum of the components I and Q.

An output 806 of the transformation circuit 801 is connected to a modulator 80a comprising, for instance a polar modulator or a polar transmitter. The modulator 80a modulates phase and amplitude portion r, p onto an RF signal. The phase and amplitude modulated signal RF is applied to the variable gain amplifier 42 for amplification.

A portion of the amplified signal in the transmitter chain is decoupled by the coupler 901 and applied to a down converter unit 210. The down converter unit 210 may comprise a local oscillator and a mixer not shown herein. The converter unit 210 converts the signal at the RF frequency to a base band low-frequency signal. The down converter 210 provides an output signal at terminal 2101 indicating the envelope power level of the output signal of power amplifier 30. Terminal 2101 is connected to the low-pass filter 721 of the low frequency path of the power control loop and to the high-pass or band-pass filter 51. The filter 51 is part of the zero crossing detector of the delay compensation block 50.

The second output terminal 2100 of the down converter unit 210 is connected to a demodulator unit 804, demodulating the signal and providing demodulated inphase and quadrature signal components I", Q". These demodulated components I" and Q" include the original signal components I and Q and also a distorted portion of those components caused by nonlinearities in different circuits of the transmitter path. The components I", Q" are applied to distortion unit 802 to determine and calculate pre-distortion factors with the original components I, Q. As pre-distortion is also delay sensitive, the delay compensation block value could also be used to adjust any delay of the measured components I", Q", improving pre-distortion quality.

The power control loop 40 adjusts an average output power independent of the distortion or pre-distortion functionalities. Still, a power ramping function can be included by selecting different reference levels in the memory device 741 and providing those levels to the mixer 711 in the low-frequency portion of the power control loop 40. This may be useful if different average levels are to be selected and the amplitude of the input signal components I, Q shall not be changed. The delay compensation block 50 is insensitive to the power ramping function and power step changes during operation of the power control loop, because low frequency and DC portions are filtered by the high-pass filters 51 and 561.

Figure 7:
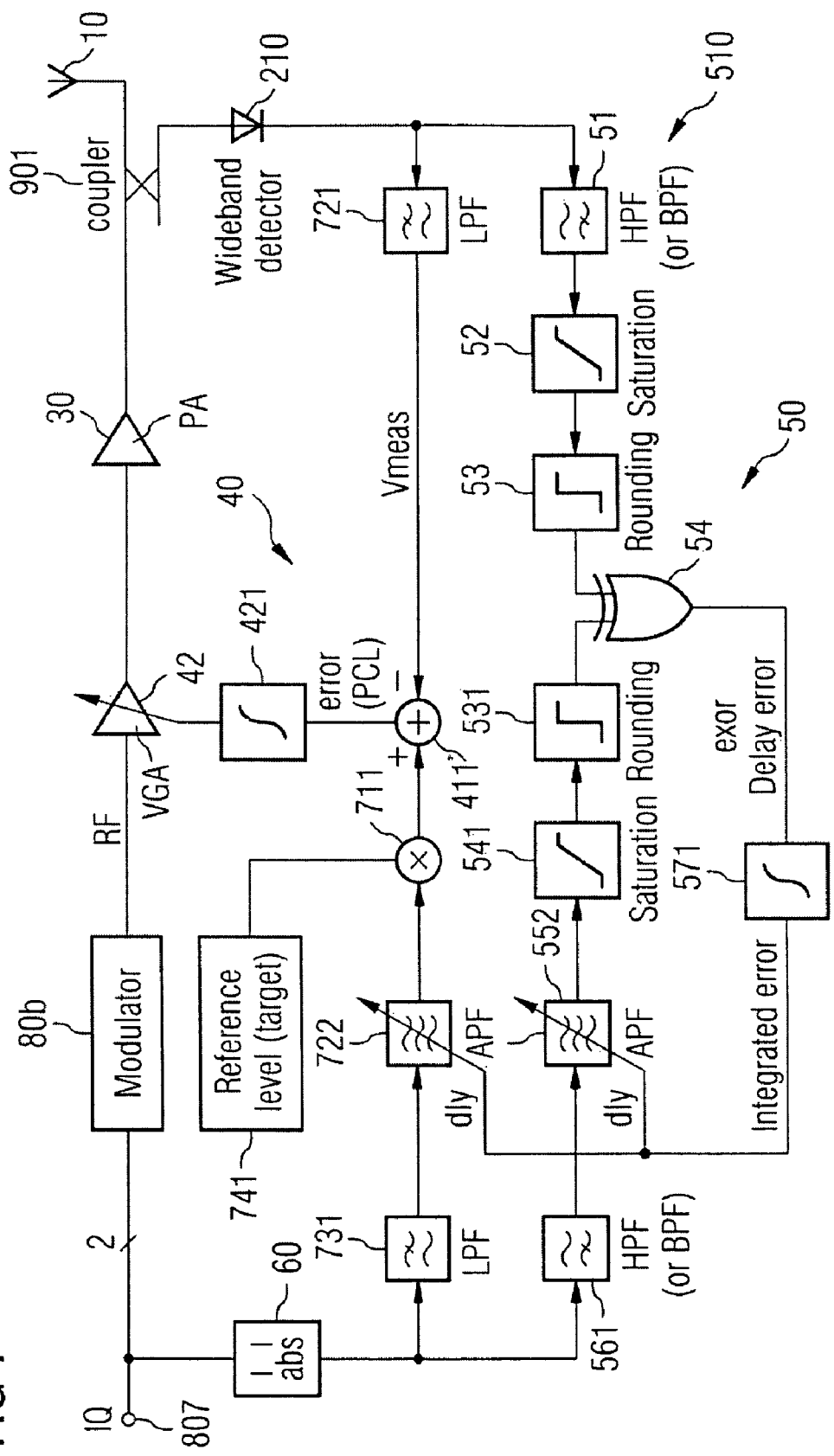
FIG. 7 illustrates a fourth embodiment of a power control loop in a transmitter device.

FIG. 7 shows a further embodiment of a transmitter device with an improved power control loop 40 and a compensation device 50. The power control loop 40 loop comprises a reference path and a measurement path. In this embodiment, the modulator device 80b comprises an input terminal for an IQ-signal having an I and a Q component. The modulator device 80b modulates and converts the IQ-signal to an RF frequency. The I and Q components are also applied to a reference envelope detector 60 determining the envelope power level. The reference power level is applied to the low-pass filter 731 of the power control loop reference path and the high- or band-pass filter 561 of the delay compensation block 50. The output of the low-pass filter 731 is connected to an all-pass filter 722 having a control input dly for adjusting the frequency bandwidth. A second all-pass filter 552 with similar transfer characteristics is disposed between the output of the high- or band-pass filter 561 and the saturation device 541 of the delay compensation block 50. Any time deviation in the zero crossing of the reference power level and the measured power level in the delay compensation block 50 is determined by the XOR delay detector 54. The output of the XOR delay detector 54 represents the delay error exor. It is integrated with the integrator 571 and used to adjust all-pass filters 722 and 552.

Figure 8:
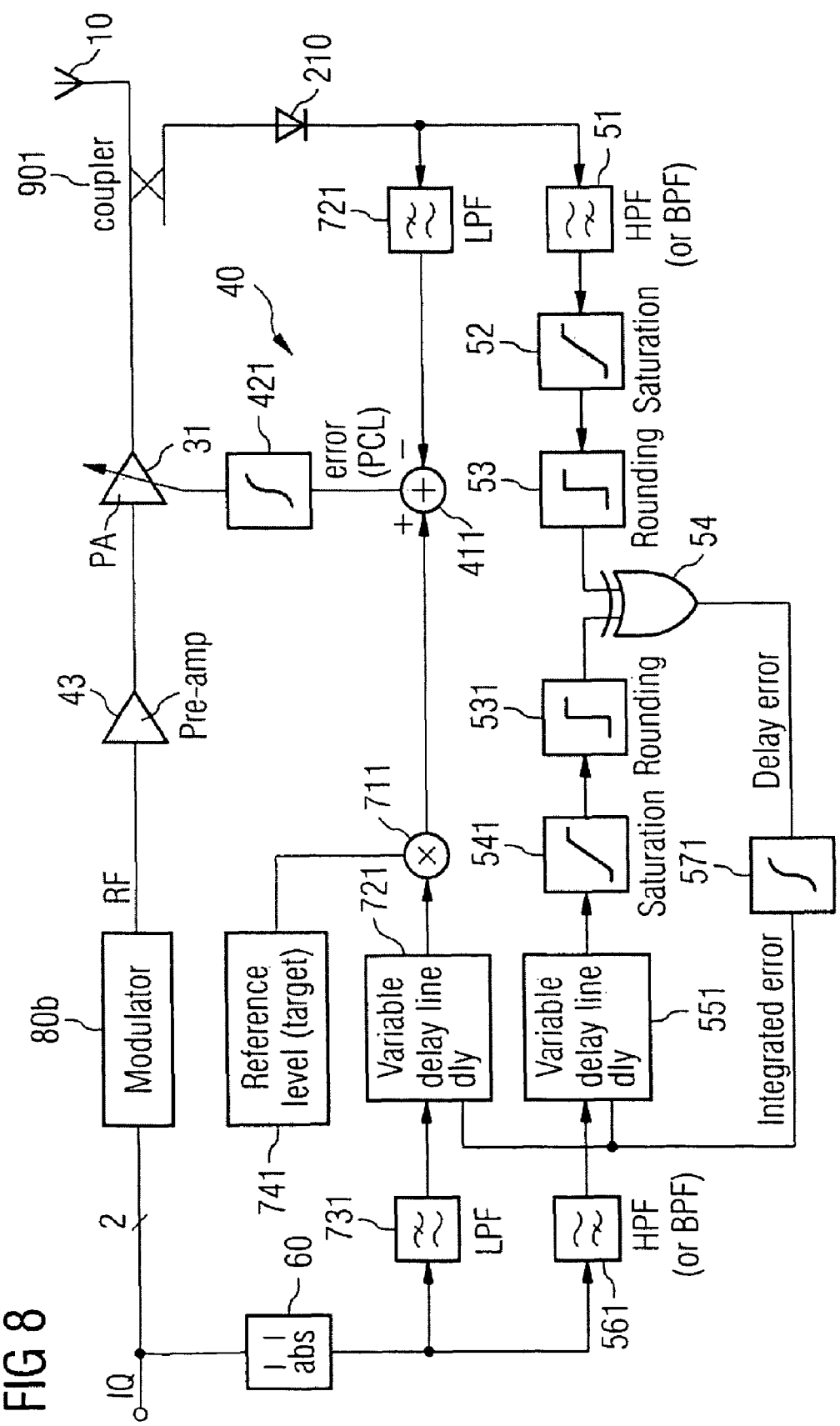
FIG. 8 shows a fifth embodiment of a power control loop in a transmitter device.

FIG. 8 shows a different embodiment of a transmitter device with the power control loop 40 and the delay compensation block. In this embodiment, the transmitter path comprises a pre-amplifier 43 with a fixed gain placed between the modulator device 80b and an adjustable power amplifier 31. The control input of the power amplifier 31 is connected to the output of the error integrator 421 of the power control loop 40. In comparison to the previous embodiments the output of the power amplifier 31 is coupled to the antenna 10 without further amplifying the output signal. In other words, the power control loop 40 is used in this embodiment to adjust the total output power by selecting the corresponding gain of the power amplifier 31.

Figure 9:
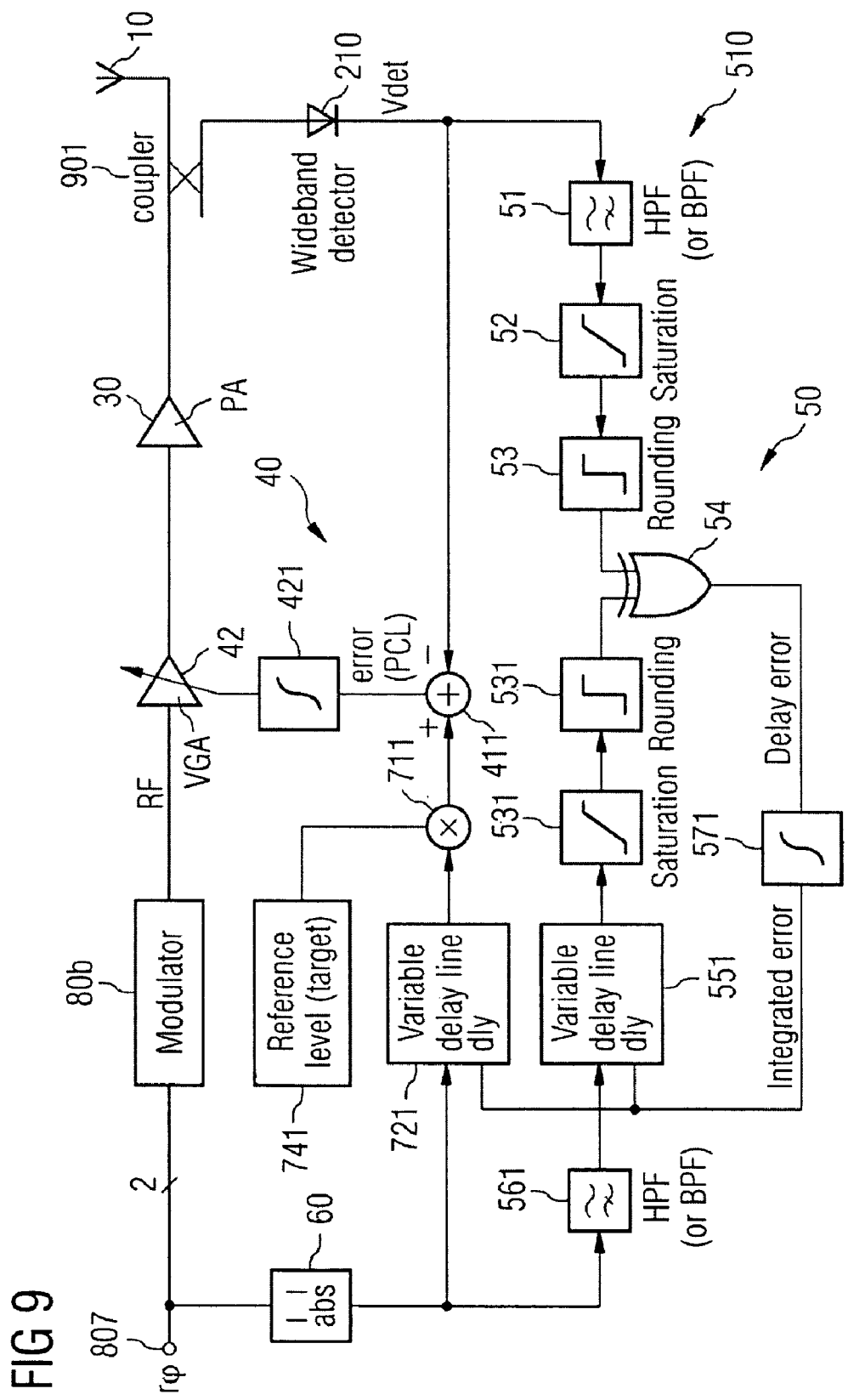
FIG. 9 illustrates a sixth embodiment of a power control loop in a transmitter device.

Yet another embodiment of a transmitter device is illustrated in FIG. 9. In this embodiment, the power control loop 40 comprises a low-frequency path arranged in parallel to a high-frequency path comprising the delay compensation block 50. The low-frequency path of the power control loop 40 is coupled with an input of the adder 411 directly to the output of the wideband detector 210. Additional low-pass filtering of the wideband detector's output signal vdet is not conducted. In the same manner the output of the reference envelope detector 60 is connected directly to the input of the variable delay line 721 without additional low-pass filtering. The subtraction block 411 compares the entire envelope of the reference and the measured signals. This may enable a much wider power control loop bandwidth possibility.

Figure 10:
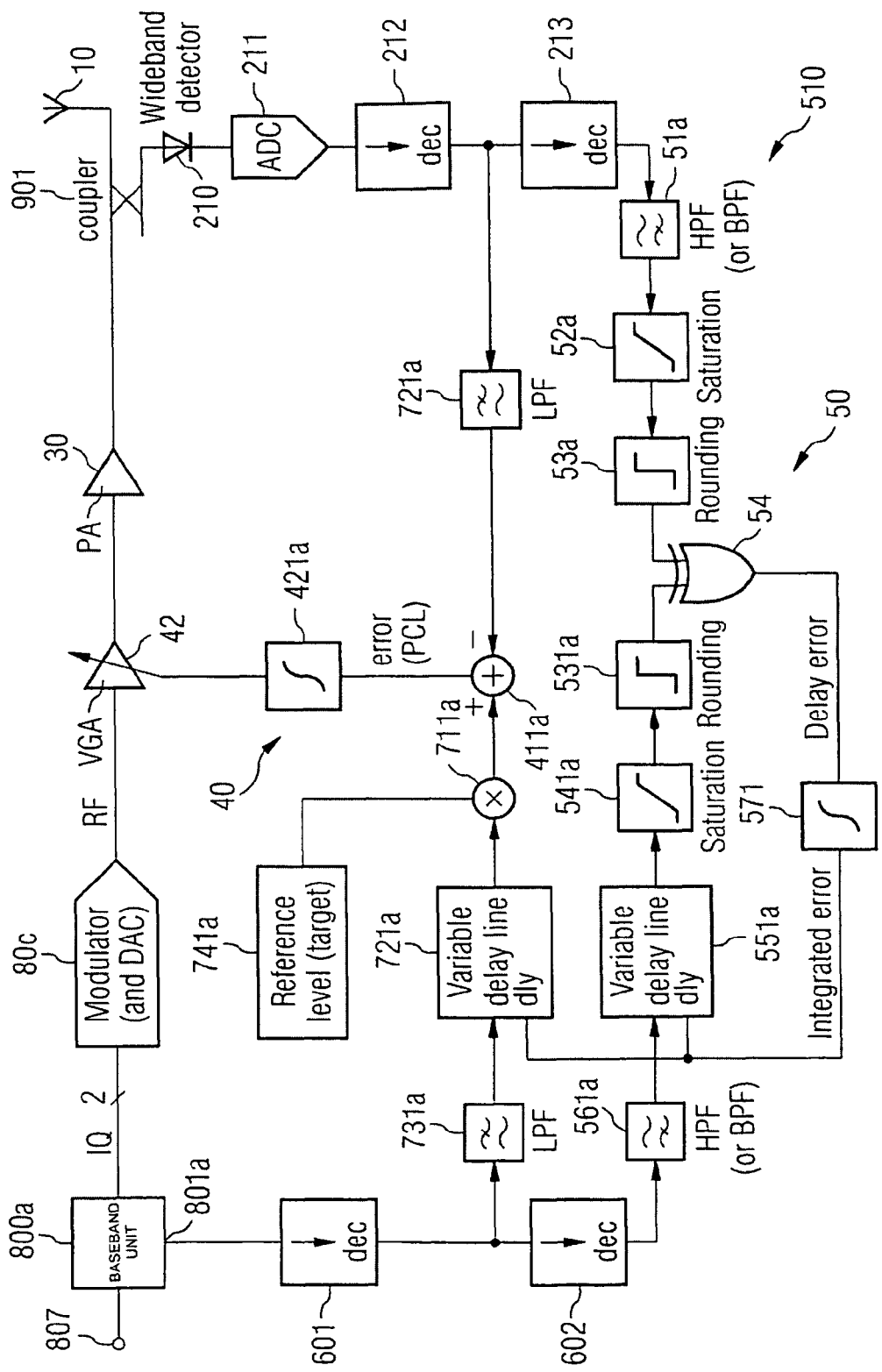
FIG. 10 shows a seventh embodiment of a power control loop in a transmitter device.

FIG. 10 shows an embodiment with a transmitter device using a digital power control loop 40 and a digital delay compensation block 50. The signal to be transmitted is applied to terminal 807 connected to the base band unit 800a. The base band unit 800a may include a pre-distortion circuitry, digital filtering and anti-aliasing and other signal processing and preparation circuitry. The output of the base band unit 800a for the digital output signal IQ is connected to a digital modulator 80c, which may comprise a digital to analog converter DAC. The modulator modulates the IQ-signal onto a carrier signal and provides a high frequency signal RF at its output.

In addition, the base band unit 800a comprises a second output 801a, on which a data word is provided. This data word represents the reference power level of the IQ signal. The output 801a is connected to a first decimator 601 reducing the overall time resolution. The output of the decimator 601 is coupled to a first digital low-pass filter 731a of a low-frequency path of the power control loop 40. The first decimator 601 is also connected to a second decimator 602. The output of the second decimator 602 is connected to a digital high-pass or band-pass filter 561a. The filter 561a is part of the high frequency path and more particularly of the compensation block 50.

The wideband detector 210 is implemented as an envelope detector for measuring the envelope signal. In response to the measured signal it provides a signal indicating an average output power level of the transmitter path. The wideband detector 210 is connected to an analog digital converter circuit 211 converting the measured analog output power level to a digital data word. The data word is applied to a third decimator 212 and a fourth decimator 213 connected in series. Between the third decimator 212 and the fourth decimator 213, a node is connected to a second digital low-pass filter 721a of the power control loop 40. The output of the fourth decimator 213 is coupled to a digital zero crossing detector 510 and to a digital high-pass filter 51a.

In the embodiment, the several elements and circuitry for the power control loop 40 and the delay compensation block 50 are implemented by digital signal processing. For example, the variable delay line 551a in the delay compensation block 50 and the delay line 721a in the low frequency path of the power control loop 40 may be implemented using tapped delay lines. The integrator 421a of the power control loop 40 may output an analog signal for the variable gain amplifier 42 or a digital data word if the amplifier 42 comprises a discrete gain adjustment.

Of course, the signals from the wideband detector 210 can also be converted to digital data words after high-pass or low-pass filtering. It is also possible to process analog signals in the low-frequency path of the power control loop 40 and use digital signals in the delay compensation block 50 for adjusting the delay lines 721a and 551a.

Figure 13:
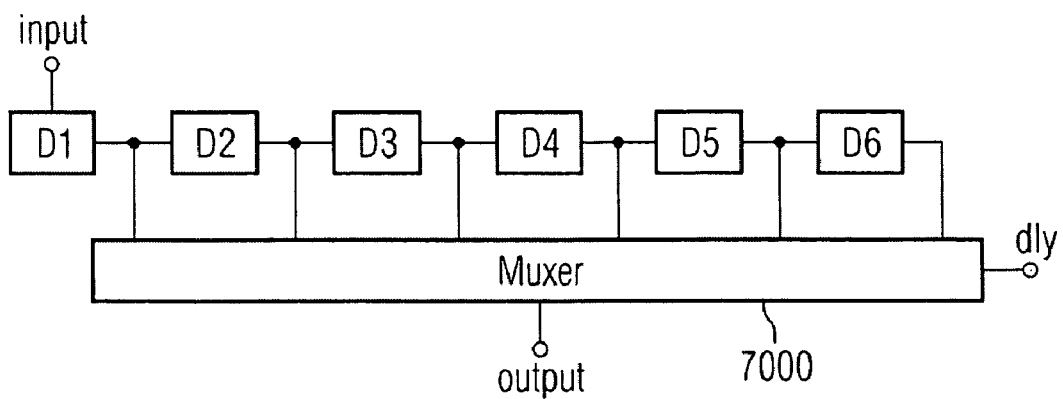
FIG. 13 shows an embodiment of variable delay line.

FIG. 13 shows a possible implementation of a tapped delay line with several delay elements D1 to D6 connected in a series. Between each of the delay elements D1 to D5 and after the last element D6 a tap is disposed connected to a multiplexer unit 7000. The multiplexer unit 7000 switches one of its input terminals connected to the corresponding taps to its output terminal in response to a control signal dly. The signal at the input of the delay line is delayed in each of the delay elements D1 to D6. With the controller signal dly one of the delayed input signals is supplied to the output. Hence, the signal at the input of the tapped delay line is delayed by a specific amount of time. The delay is given by the sum of the delays of each delay element connected upstream to the tap coupled to the output of the multiplexer unit 7000.

Figure 11:
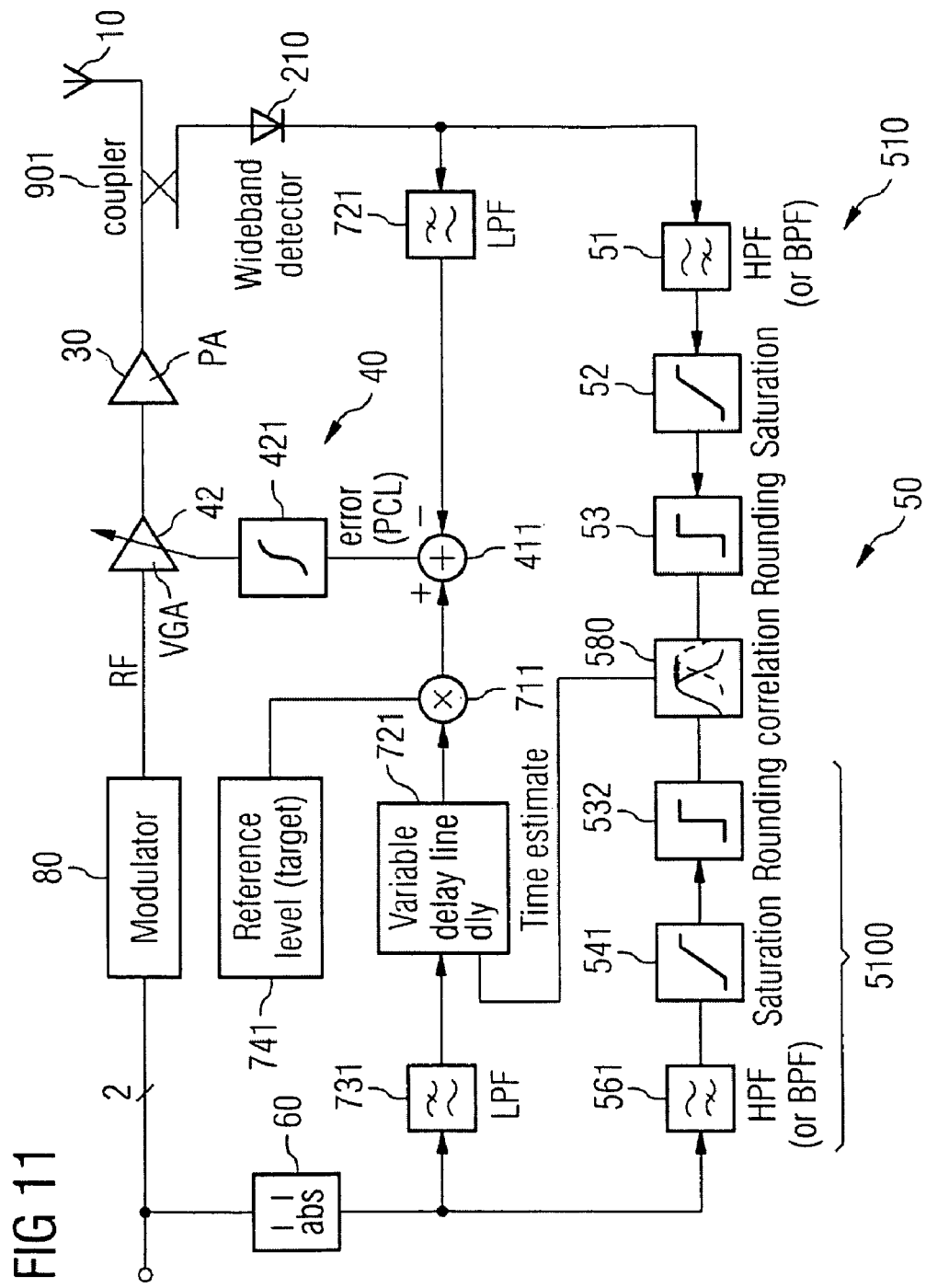
FIG. 11 shows an eighth embodiment of a power control loop in a transmitter device.

FIG. 11 shows a further embodiment of a power control loop 40 and a delay compensation block 50. In this embodiment, the delay compensation block 50 comprises a first zero detector 510 connected with its input to the wideband detector 210. A second zero crossing detector 5100 is connected to the reference envelope detector 60. The second zero crossing detector 5100 comprises a high-pass filter 561, a saturation unit 541 and a rounding device 531 similar to the first zero crossing detector 510. The signal of both zero crossing detectors 510 and 5100 are applied to a correlation device 580 disposed between them. The correlation device 580 estimates the time difference between the output signals of the zero crossing detectors 510 and 5100. In response to the estimation it generates a corresponding signal indicating the time shift in between. The signal is used as a control signal for the variable delay line 721 of the low-frequency path in the power control loop 40. Consequently, a time misalignment between the average reference power and the average measured power level can be estimated and corrected with the correlation device 580.

Figure 14:
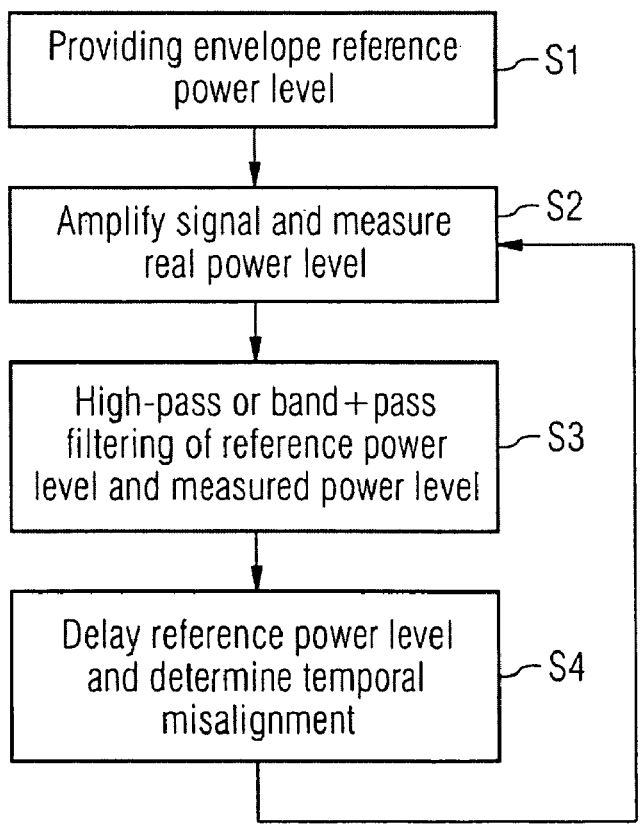
FIG. 14 illustrates an embodiment of a method to control the output power of an amplifier.

FIG. 14 illustrates an embodiment of a method to control the output of an amplifier. While the exemplary method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

In step S1, the reference envelope power is provided. The reference power level represents the desired power level for the amplifier. The reference envelope power level may be determined by detecting an envelope of the signal to be amplified as seen in the embodiment of FIG. 4 or can be provided as an external parameter as shown for example in the embodiment according to FIG. 6. The signal is then amplified and the real envelope power level is determined in step S2. Due to several external effects the real envelope power level may differ from the desired one, so the amplification gain has to be changed.

For this purpose, the reference envelope power level and the measured envelope power level may be used to determine the deviation between them. With the deviation an adjustment value can be determined. The deviation error due to temporal misalignment is measured in step S3 by filtering the reference envelope power level and the measured envelope power level to suppress low frequency and DC portions in both power levels. Then the temporal misalignment between both filtered power levels is determined in step S4. The result is used to delay the reference power level used to determine the deviation error and to adjust the amplification gain.

The different features of the embodiments shown herein can be combined by one skilled in the art to achieve one or more advantages of the present invention. Digital or analog signal processing as well as combinations thereof is possible. Although specific embodiments have been illustrated and described, it will be appreciated by one of ordinary skill in the art that any arrangement which is calculated to achieve the same purpose may be substituted for the specific embodiment shown. The above description is intended to be illustrative and not restrictive and shall cover any variations of the invention. The scope of the invention includes any other embodiments and applications in which the above structures and methods may be used. The scope of the invention should therefore be determined with reference to the appended claims along with the scope of equivalence to which such claims are entitled.

It is emphasized that the abstract is provided to comply with 37 CFR. Section 1.72(b) requiring an abstract that will allow the reader to quickly ascertain the nature and gist of a technical disclosure. It is submitted with the understanding that it will not be used to interpret or limit the scope of meaning of the claims.

The invention claimed is:

1. A power control loop, comprising:
a low frequency signal path configured to receive a first signal indicating a measured power level and a second signal indicating a reference power level;
a high frequency signal path configured to receive the first signal and the second signal, the high frequency signal path comprising a compensation block configured to provide an adjustment signal for delaying the second signal to form a delayed second signal in response to signal components of the first and second signal, for use to generate a power control signal; and
a control device configured to provide the power control signal in response to a difference between the measured power level of the first signal and the reference power level of the delayed second signal.

2. The power control loop of claim 1, wherein the measured power level comprises an envelope of a measured signal and the reference power comprises an envelope of a reference signal.

3. The power control loop of claim 1, wherein the compensation block comprises at least one zero crossing detector configured to detect a zero crossing of the signal components.

4. The power control loop of claim 3, wherein the zero crossing detector comprises a saturation amplifier configured to provide pulsed signals in response to the signal components.

5. The power control loop of claim 1, wherein the compensation block comprises a delay locked loop configured to provide the adjustment signal.

6. The power control loop of claim 1, wherein the high frequency signal path comprises a first high-pass or band-pass filter configured to receive and filter the first signal and a second high-pass or band-pass filter configured to receive and filter the second signal.

7. The power control loop of claim 1, wherein the compensation block comprises a logical operator device coupled with its inputs to respective zero crossing detectors.

8. The power control loop of claim 1, wherein the compensation block comprises a delay circuit configured to delay the signal components of the first signal in response to the adjustment signal.

9. The power control loop of claim 1, wherein the low frequency signal path comprises a first low-pass filter configured to receive and filter the first signal and a second low-pass filter configured to receive and filter the second signal.

10. The power control loop of claim 9, wherein a delay circuit with an adjustable delay is coupled to an output of the second low-pass filter, the delay circuit comprising a control input configured to receive the adjustment signal.

11. The power control loop of claim 1, wherein the low frequency signal path comprises a delay circuit with an adjustable delay configured to delay the signal portion of the second signal in response to the adjustment signal.

12. The power control loop of claim 1, wherein the low frequency signal path comprises a multiplier circuit to scale the second signal with a reference scaling factor.

13. The power control loop of claim 1, wherein the compensation block comprises a circuit configured to determine a temporal correlation between the signal components of the first and the second signal.

14. The power control loop of claim 1, wherein the low frequency signal path and the high frequency signal path are adapted to each receive digital first and digital second signals.

15. The power control loop of claim 1, wherein the first signal indicates a measured envelope power level.

16. The power control loop of claim 1, wherein the compensation block is configured to determine a deviation of a timing between the first signal and the second signal, and wherein the adjustment signal is a function of the timing deviation.

* * * * *